United States Patent [19]
Schreiber et al.

[11] Patent Number: 5,855,063
[45] Date of Patent: Jan. 5, 1999

[54] METHOD OF MAKING CONTACT PAD HAVING METALLICALLY ANCHORED ELASTOMERIC ELECTRICAL CONTACTS

[75] Inventors: Chris M. Schreiber, Lake Elsinore; Bao Le, Santa Ana, both of Calif.

[73] Assignee: Packard Hughes Interconnect Company, Irvine, Calif.

[21] Appl. No.: 944,776

[22] Filed: Oct. 6, 1997

Related U.S. Application Data

[62] Division of Ser. No. 654,509, May 28, 1996, Pat. No. 5,738,530.

[51] Int. Cl.⁶ ..................................................... H01K 3/22
[52] U.S. Cl. ................................ 29/848; 29/874; 29/883; 29/884; 439/67; 439/68
[58] Field of Search ............................ 29/846, 874, 877, 29/883, 884; 156/229, 257, 413; 439/67, 69, 77, 68

[56] References Cited

U.S. PATENT DOCUMENTS

| | | | |
|---|---|---|---|
| 3,870,978 | 3/1975 | Dreyer | 439/86 |
| 3,971,610 | 7/1976 | Buchoff et al. | |
| 4,548,451 | 10/1985 | Bernarr et al. | 439/66 |
| 4,770,641 | 9/1988 | Rowlette | 439/86 |
| 4,813,129 | 3/1989 | Karnezos | 29/832 |
| 5,123,849 | 6/1992 | Deak et al. | 439/66 |
| 5,147,208 | 9/1992 | Bacher | 29/846 X |
| 5,158,466 | 10/1992 | Schreiber et al. | 439/67 |
| 5,194,698 | 3/1993 | Souto et al. | 174/250 |
| 5,197,184 | 3/1993 | Crumly et al. | 29/846 |
| 5,207,887 | 5/1993 | Crumly et al. | 205/78 |
| 5,233,157 | 8/1993 | Schreiber et al. | 219/121.68 |
| 5,245,750 | 9/1993 | Crumly et al. | 29/840 |
| 5,264,787 | 11/1993 | Woith et al. | 324/159 P |
| 5,288,235 | 2/1994 | Sobhani | 29/846 X |
| 5,339,027 | 8/1994 | Woith et al. | 324/754 |
| 5,342,207 | 8/1994 | Sobhani | 29/846 X |
| 5,364,277 | 11/1994 | Crumly et al. | 439/67 |
| 5,390,412 | 2/1995 | Gregoire | 29/848 |
| 5,413,659 | 5/1995 | Koskenmaki et al. | 29/846 X |

*Primary Examiner*—Carl J. Arbes
*Attorney, Agent, or Firm*—Lawrence B. Plant

[57] ABSTRACT

A printed-circuit-type electrical contact pad having a plurality of electrically conductive metal traces and a plurality of protuberant electrical contacts projecting from the traces. The protuberances comprise an electrically conductive elastomer having a wide base portion anchored in the end of the trace by a truncated portion of the trace upstanding from the face of the pad. A denuded tip portion of the elastomer extends from the base portion for resiliently engaging a contact site on an electrical device to which the pad is coupled. A unique process for making the aforesaid pad is disclosed and claimed.

6 Claims, 6 Drawing Sheets

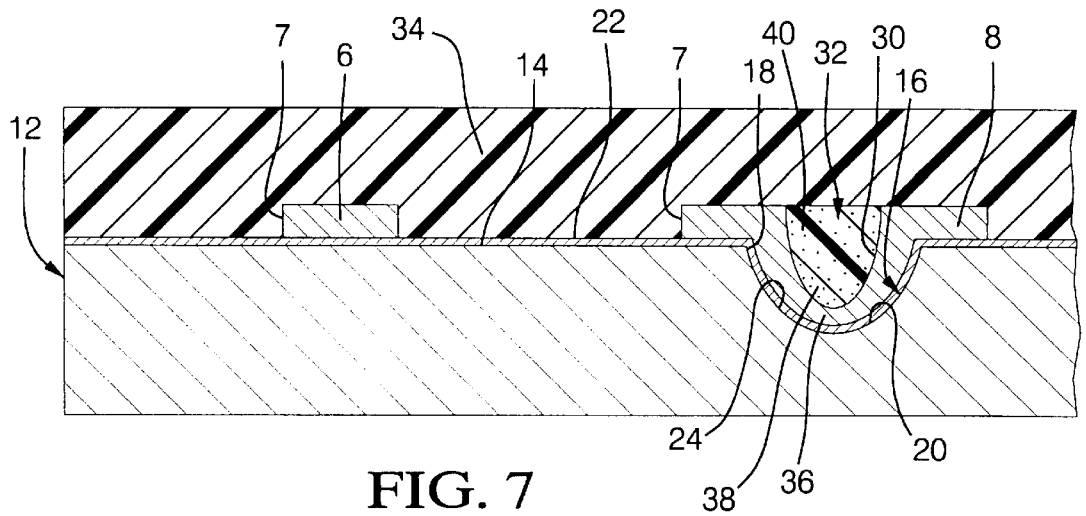
FIG. 7
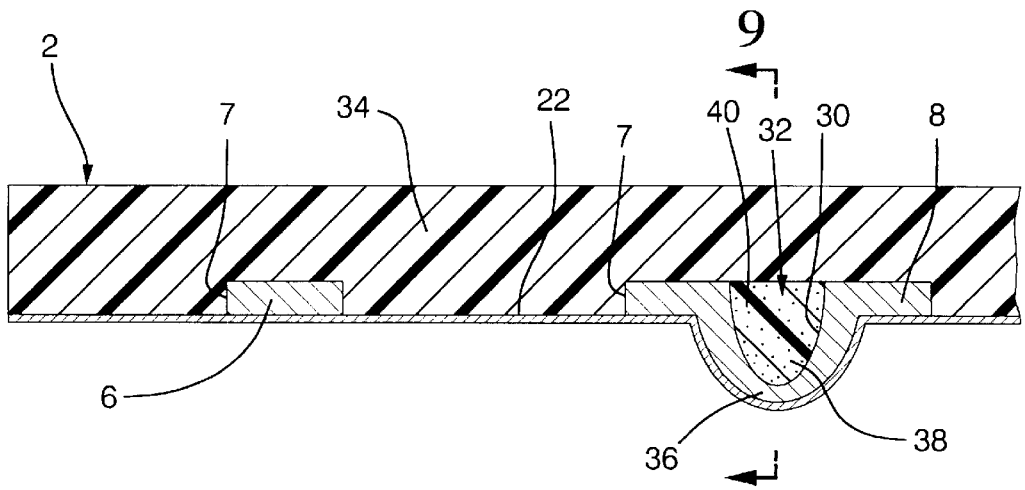
FIG. 8
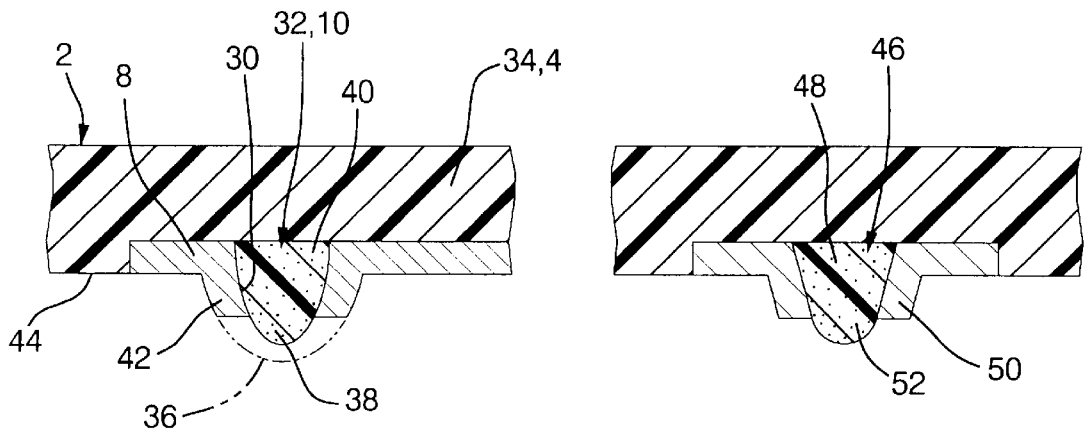
FIG. 9
FIG. 10

METHOD OF MAKING CONTACT PAD HAVING METALLICALLY ANCHORED ELASTOMERIC ELECTRICAL CONTACTS

This is a division of application Ser. No. 08/654,509 filed on May. 28, 1996 U.S. Pat. No. 5,738,530.

This invention relates to printed-circuit-type, electrical contact pads having a plurality of protuberant, electrically conductive elastomeric contacts metallically anchored thereon, and a method of making same.

BACKGROUND OF THE INVENTION

Electronic components (e.g., micro-chips, printed circuits, etc.), and packaging therefor (hereafter devices) are getting smaller and smaller. Moreover, such devices are getting more complex with a multiplicity of components, and electrical contacts therefor, being combined in ever smaller arrangements and packages. As such devices get smaller and more complex, the density (i.e., number per inch) of the input and output electrical contacts therefor increases and the pitch between such contacts decreases. Indeed semiconductor devices are available today having as many as 2000 contacts per $inch^2$ and pitches as low as 0.003 inches. As a result the electrical connections to such devices are getting smaller and smaller. Electrical contact to such devices is commonly made by means of a printed-circuit-type contact pad comprising a plurality of circuit traces and contacts formed on the surface thereof using printed circuit manufacturing technology. As density increases and the pitch decreases, it becomes increasingly more difficult to provide multiple reliable electrical contacts to the device because surface irregularities that occur during the manufacture of the device or the contact pad can result in the inability of some of the electrical contacts on the pad to make good electrical contact to their designated sites on the device it is to contact.

It is known to make electrical contact to miniature electronic devices by providing a flexible, printed-circuit-type electrical contact pad having a plurality of metallic bumps thereon, and to press the flexible pad against the device by means of an elastomeric cushion located behind the contact pad. The cushion causes the flexible pad to conform to the topography of the device, and cause the bumps to contact their designated sites despite surface irregularities in either the device or the pad. It is also known in the printed circuit art to electrically connect circuit traces, as well as make electrical contacts to such traces, using electrically conductive elastomers (e.g., see Buchoff et al U.S. Pat. No. 3,971, 610).

As the density of the input and output contacts to the devices increases so must the density of the circuit traces and contacts on the contact pad. As the density of contacts and circuit traces increases and the pitch decreases, the structure becomes less resilient due to the increased stiffness resulting from an increase in metal and a decrease in resilient dielectric, and otherwise flexible electrical contact pads tend to become stiffer and less compliant to the surface of the device they contact. As a result, there is the prospect of one or more poor connections being made to the device. The same problem can occur at the interface between adjoining contact pads that couple one printed-circuit-type electrical cable to another.

SUMMARY OF THE INVENTION

The present invention permits elimination of the elastomeric cushion customarily used behind the flexible contact pads by providing each individual contact bump on the pad with a compliant tip formed from an electrically conductive elastomer. The present invention also provides a unique method for metallically anchoring such tip to the pad.

More specifically, the present invention contemplates a printed-circuit-type electrical contact pad having a dielectric substrate, a contact face on the substrate which carries an array of electrically conductive metal traces, and a plurality of protuberant, electrically conductive contacts at the ends of the traces. The protuberant, electrically conductive contacts each comprises an electrically conductive elastomer which is anchored in, and projects from, the end of an associated trace. The protuberant elastomeric contact has (1) a base portion anchored in a truncated seat portion of the trace upstanding from the face of the pad, and (2) a denuded tip portion extending from the base for resiliently contacting a site on the device with which it is associated. The dielectric substrate will preferably comprise a flexible ribbon though the contact of the present invention is also useful with rigid contact pads.

The present invention further contemplates a method of making the aforesaid contact pad including the steps of (a) forming a plurality of depressions in a surface of a mandrel, (b) covering the mandrel surface (including the inside surfaces of the depressions) with an electrically conductive coating which is poor adherent and readily separable from the mandrel; (c) covering the coating with a mask having a plurality of openings therein for defining a desired array of electrically conductive traces each terminating at a said depression; (d) depositing sufficient metal on the electrically conductive coating through the openings in the mask to form the traces and to coat the inside surfaces of the depressions. The trace-forming metal so deposited will not completely fill the depressions, but rather leave cavities in the traces at the depressions, which cavities extend deep into the depression and beneath the mandrel's surface; (e) removing the mask; (f) filling the cavity in each trace with an electrically conductive elastomer and allowing it to cure therein; (g) applying a dielectric substrate to the traces; (h) separating the dielectric substrate and traces from the mandrel so as to leave the poorly adherent, electrically conductive coating adhering to the dielectric substrate and traces; (i) removing the poorly adherent, electrically conductive coating from the tracings and the substrate; and (j) removing the trace-forming metal from a tip of the elastomer so as to expose only such tip and to leave a base portion of the elastomer embedded in, and anchored to, the trace by a truncated seat portion of the trace which seat portion is upstanding from the substrate and is formed from the trace-forming metal remaining after the tip has been exposed.

DETAILED DESCRIPTION OF A SPECIFIC EMBODIMENT OF THE INVENTION

The invention will better be understood when considered in the light of the following detailed description of a specific embodiment thereof which is given hereafter in conjunction with the several figures in which:

FIGS. 3–7 are sectioned views of the mandrel of FIG. 2 illustrating sequential steps of a process for forming the cable and contact pad of FIG. 1;

FIG. 8 illustrates the contact pad after having been removed from the mandrel of FIG. 2;

FIG. 9 is a view in the direction 9—9 of FIG. 8 after extraneous metal has been removed from the face of the pad;

FIG. 10 illustrates another embodiment of an electrical contact in accordance with the present invention;

Figure 1:
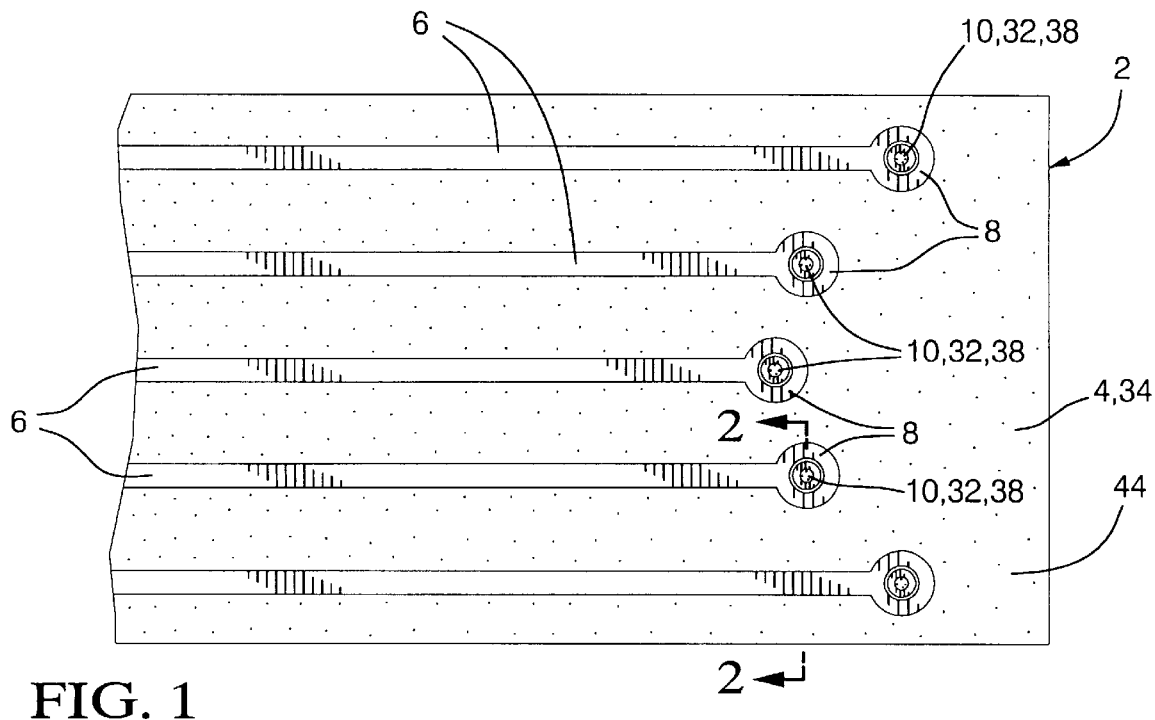
FIG. 1 is a plan view of a printed-circuit-type electrical cable having a contact pad made in accordance with the present invention.
Figure 2:
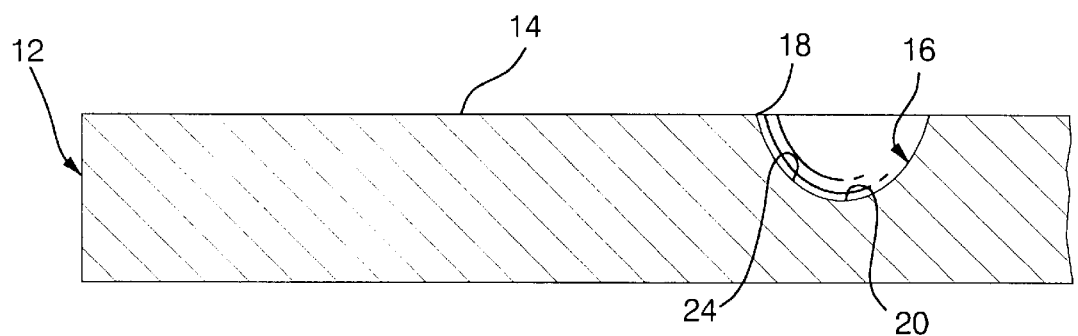
FIG. 2 depicts a sectioned view of a mandrel used to make the cable and contact pad of FIG. 1 as viewed in the direction 2—2 of FIG. 1.

FIG. 1 depicts a flexible, printed-circuit-type electrical cable having a terminal contact pad 2 comprising a flexible dielectric substrate 4 having an array of electrically conductive metal traces 6 on a contact face thereof. The traces 6 each terminate in an electrical contact portion 8 which has an electrically conductive elastomeric protuberance 10 projecting therefrom. The protuberance 10 is best shown in FIG. 9, and will be described in more detail hereafter in connection with FIG. 9.

The contact pad 2 of FIG. 1 is made by the process illustrated in FIGS. 2–9. This process is essentially a modified version of the additive process for forming electrical circuits having integral raised features described in U.S. patent Crumly et al U.S. Pat. No. 5,197,184, which is intended to be herein incorporated by reference. More specifically, a mandrel 12 is provided having a forming surface 14 and a plurality of depressions 16 formed in the forming surface 14.

The mandrel will preferably comprise stainless steel, but may comprise any of a variety of other materials which are capable of poorly adherently supporting a conductive coating deposited thereon. Hence, suitable mandrel materials may either be innately conductive or capable of having at least one surface thereof rendered conductive. Suitable mandrel materials will include nickel, 300 series stainless steel, 400 series stainless steel and titanium. Where the mandrel 12 is a nonconductive material (e.g., acrylonitrile butadiene styrene), its surface may be made conductive by catalyzing the surface and electrolessly depositing a layer of electroless copper or nickel thereon using conventional processes for electrolessly depositing such metals as are well known to those skilled in the metal plating art. Any other technique for rendering the surface conductive (e.g., metal spraying, vacuum metal deposition, or sputtering) would also be acceptable.

Figure 3:
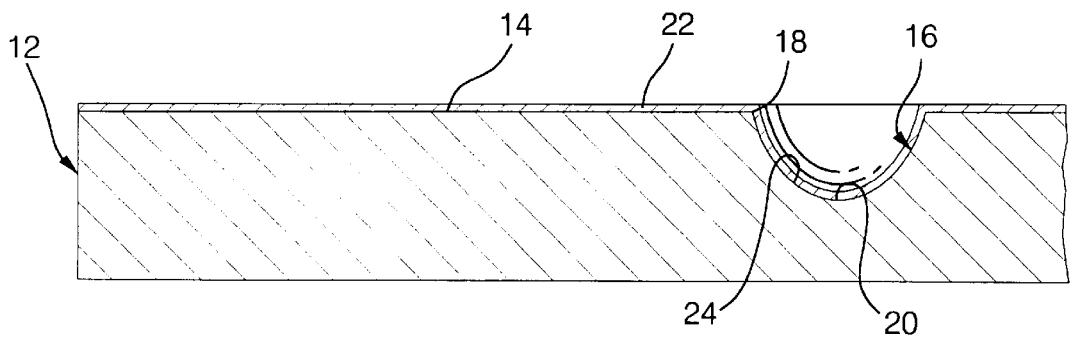
Figure 4:
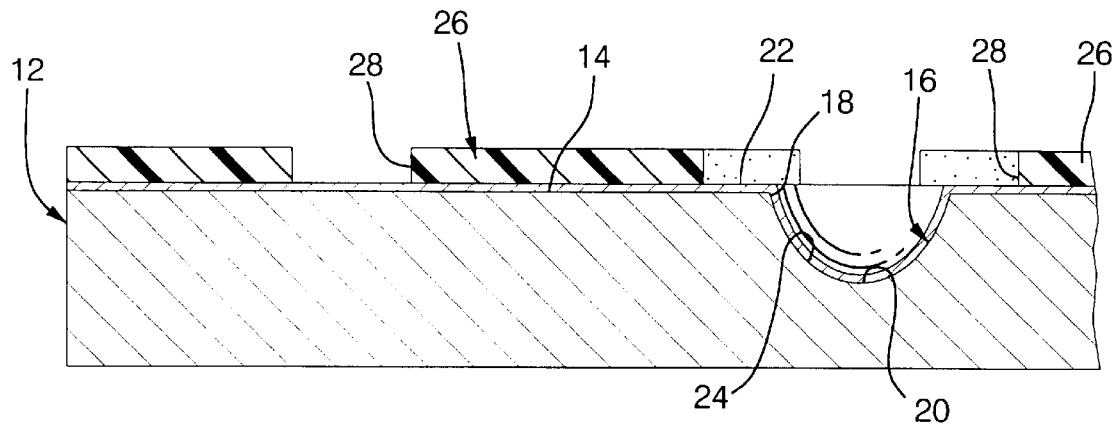

The depression 16 has its widest dimension at the mouth 18 thereof, and becomes progressively narrower as it approaches the bottom 20 of the depression 16. The depression 16 will preferably be conically shaped, but may alternatively have a hemi-oval shape such as illustrated in the Figures. As illustrated in FIG. 3, a thin (i.e., about $5\mu$ to about $15\mu$) layer of metal 22 is deposited on the working surface 14 of the mandrel 12 and the inside surface 24 of the depression 16. The metal layer 22 will adhere to the mandrel 12, but not so strongly that it cannot be readily separated therefrom by peeling the cable from the mandrel in accordance with conventional practice. The metal layer 22 will preferably comprise a flash coat of electrodeposited copper deposited from any of a variety of commercially available such copper plating baths (e.g., copper sulfate, copper fluoroborate, copper cyanide).

A mask 26 is next applied atop the thin metal layer 22. The mask 26 defines a plurality of openings 28 which conform to the configuration of the array of electrically conductive traces 6 to be formed on the cable and pad 2. Any suitable mask known to those skilled in the art may be used, but will preferably be a photoresist mask of the type which are well known and commonly used in the printed circuit board and integrated circuit manufacturing arts. A most preferred such mask is available commercially from the E.I. DuPont DeNemours company under the trade name Riston®.

Figure 5:
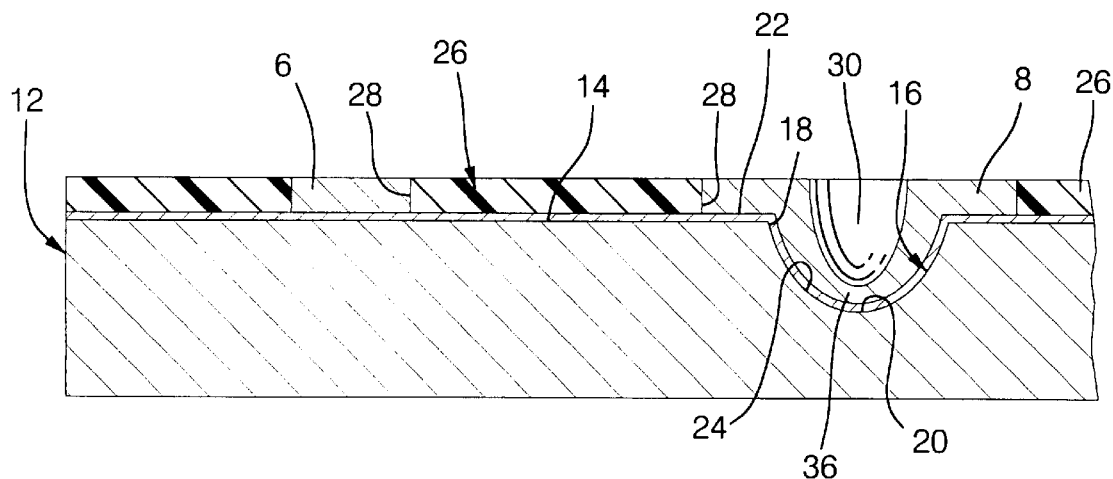
Figure 6:
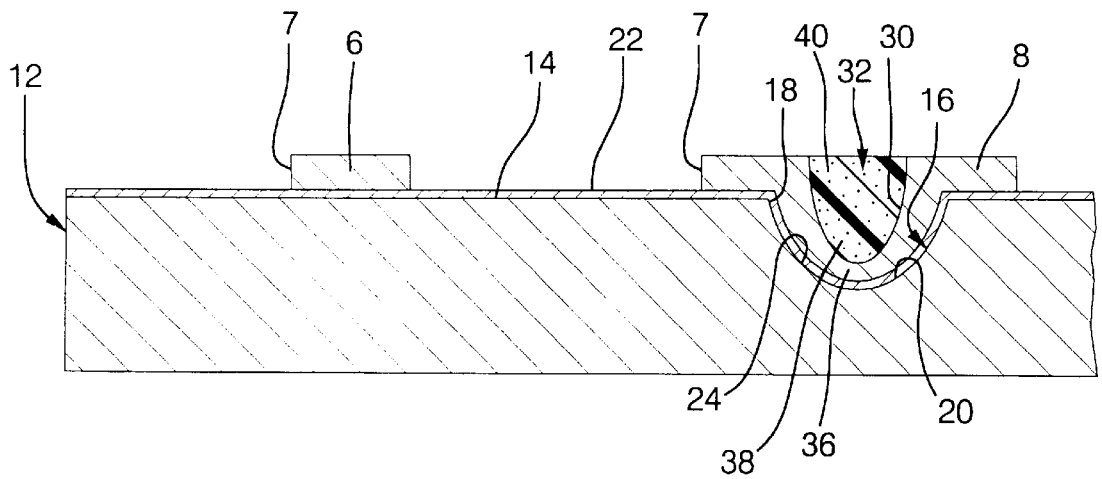
Figure 11:
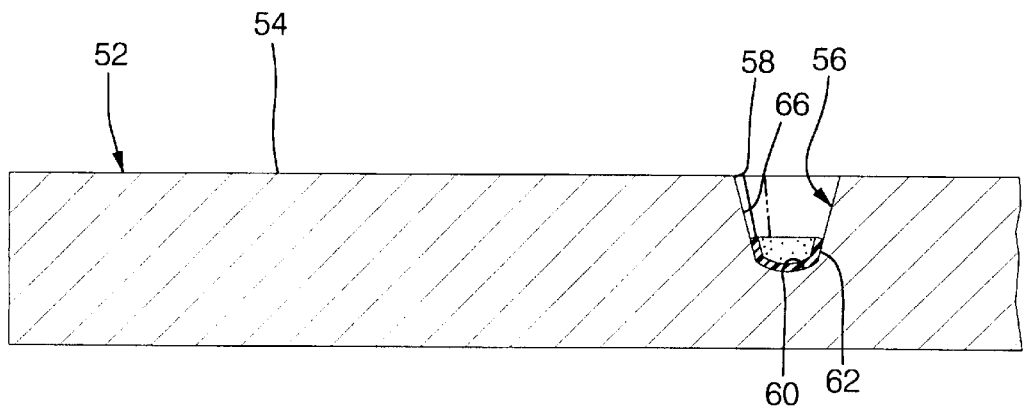
FIGS. 11–18 are similar to FIGS. 2–9, but for a different embodiment of the method.

After the mask 26 has been applied atop the metal 22, suitably irradiated and developed, electrically conductive traces 6 and termination contact portions 8 thereof, are electro-formed into the openings 28 in the mask 26 (see FIG. 5). The traces 6 and contact portions 8 will preferably comprise electro-formed copper, though other electrically conductive metals (e.g., silver, gold, etc.) may also be used. Electro-forming of the traces 6 will preferably be done using an electroplating bath having a sufficiently low throwing power that the metal will deposit on the coating 22 at the surface 14 at a faster rate than on the inside surface 24 near the bottom 20 of the depression 16. As a result, the metal deposited near the bottom 20 of the depression 16, will be thinner than near the mouth 18 of the depression 16 as illustrated in FIGS. 5–8. A suitable such low throwing copper bath for this purpose is commercially available from the Sol-Rex company under the name CuBath®. Electroforming is done for about 60 minutes at a current density of about 30 amps/ft$^2$ and a temperature of about 68° F. to yield a Cu thickness of about $25\mu$–$50\mu$.

After the traces 6 and contact portions 8 have been electro-formed onto the metal coating 22 inside and outside the depression 16, the mask 26 is removed so as to leave the traces 6 and contact portions 8 standing in relief from the coating 22 on the mandrel 12. The mask 26 is preferably removed by dissolution in an alkaline solution as is well known in the art.

The electro-forming leaves a cavity 30 formed in the center of the contact portion 8 of trace 6 as a result of the presence of the depression 16 in the mandrel 12. This cavity 30 extends well below the surface 14 of the mandrel 12 as illustrated in FIG. 5. The cavity 30 is then filled with an electrically conductive elastomeric material 32 which is allowed to cure therein to a resilient state. Suitable electrically conductive elastomers for this purpose include polyurethane, plasticized vinyl, neoprene, butyl rubber, EPDM, and silicone rubber all filled with conductive particles such as carbon or metal (e.g., Cu, Ag, Sn, Au, Zn). Some abrasive particles such as aluminum oxide or metallized glass or ceramic may also be included to break through any oxides that might form on the contact surfaces of the devices the pad of the present invention engages. Certain conductive oxides such as nickel oxides are seen to be particularly useful for this purpose. A preferred electrically conductive elastomer for this purpose comprises nickel, conductive particles in a thermoplastic polyurethan elastomer (TPU) matrix and is commercially available from the Dexter and/or Ablestik companies.

After the electrically conductive elastomer 32 has cured sufficiently in the cavity 30, the traces 6 and contact portions 8 are attached (preferably embedded in) a suitable dielectric material 34 which serves as a carrier/support for the traces 6 and contact portions 8. The dielectric will preferably be flexible. Application of the dielectric 34 to the traces 6 and contact portions 8 may conveniently be accomplished utilizing any of the techniques well known to those skilled in this art (e.g., casting a layer of dielectric material atop the traces 6 and contact portion 8, etc.). Preferably, the dielectric 34 will be applied by laminating a layer (i.e., about $25\mu$ thick) of Kapton® atop the traces 6, contact portions 8 and metal coating 22, and thereafter subjecting the same to a sufficiently high temperature and pressure as to cause the Kapton® and glue to flow into the spaces 7 between the traces 6 and contact portions 8 so as to effectively embed the traces 6 and contact portions 8 in the Kapton®. Thereafter and as best illustrated in FIG. 8, the pad 2 is peeled off of the mandrel 12 leaving the thin metal coating 22 covering the entire contact face of the pad 2.

After the pad 2 has been removed from the mandrel 12, the metal layer 22 is removed by chemical etching/dissolution thereof in a suitable etchant/solvent. A suitable etchant for a copper layer 22 is an aqueous solution of ammonium chloride. Thereafter, the thinner portion 36 of the metal electro-formed near the bottom 20 of the depression 16 is removed to expose the tip 38 of the elastomer 32. Removal of the metal from the tip 38 is preferably effected by dissolution. Most preferably, the solvent/etchant used to dissolve the coating 22 will continue to be applied to the face of the pad for a brief period after the coating 22 has disappeared in order to dissolve away the thinner portion 36 of the electro-formed metal deposited near the bottom 20 of the depression 16. This dissolution of the thinner portion 36 of the electro-formed metal exposes a small diameter tip 38 of the elastomeric material 32 for subsequent resilient, compliant contact with an appropriate contact site on a mating electrical device to which the contact pad is joined. The thicker metal electrodeposited near the mouth 18 of the depression 16 survives this dissolution step and traps the wider base portion 40 of the electrically conductive elastomeric material 32 therein. Hence, the base portion 40 becomes anchored to, or embedded in, an undissolved truncated portion 42 of the contact portion 8. The truncated portion 42 stands in relief from the contact face 44 of the dielectric 34 and serves to trap, or otherwise retain, the base 40 of the elastomeric material 32.

FIG. 10 illustrates a preferred embodiment of the invention wherein conductive elastomer 46 is in the form of a slender cone whose base 48 is trapped in a hollow frusto-cone of electro-formed metal 50. The elastomer 46 has a denuded tip 52 extending from the base 48 for resiliently engaging a contact site on a device to which it is attached.

The contact pad 2 of FIG. 1 can also be made by the process illustrated in FIGS. 11–18 which also uses a modified version of the process described in U.S. patent Crumly et al U.S. Pat. No. 5,197,184. More specifically, a mandrel 52, similar to that described above, is provided having a forming surface 54 and a plurality of depressions 56 formed in the forming surface 54.

Figure 12:
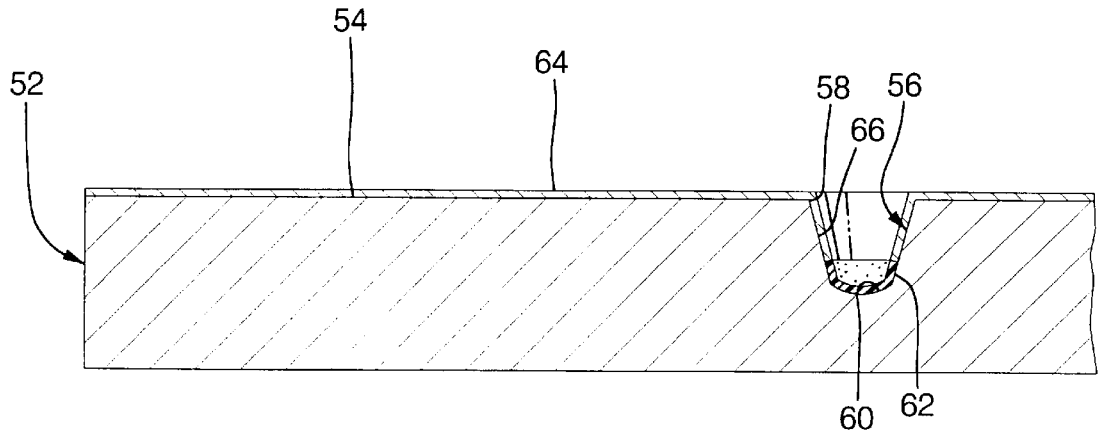
Figure 13:
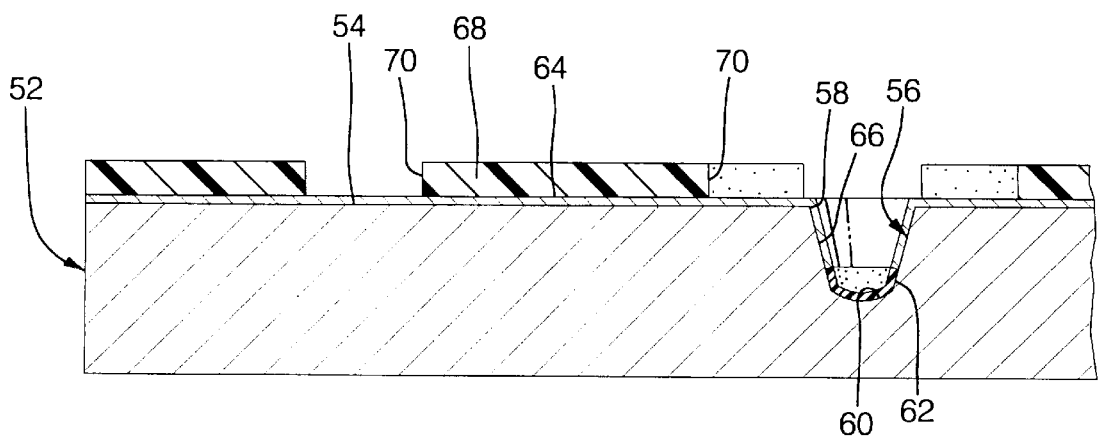
Figure 14:
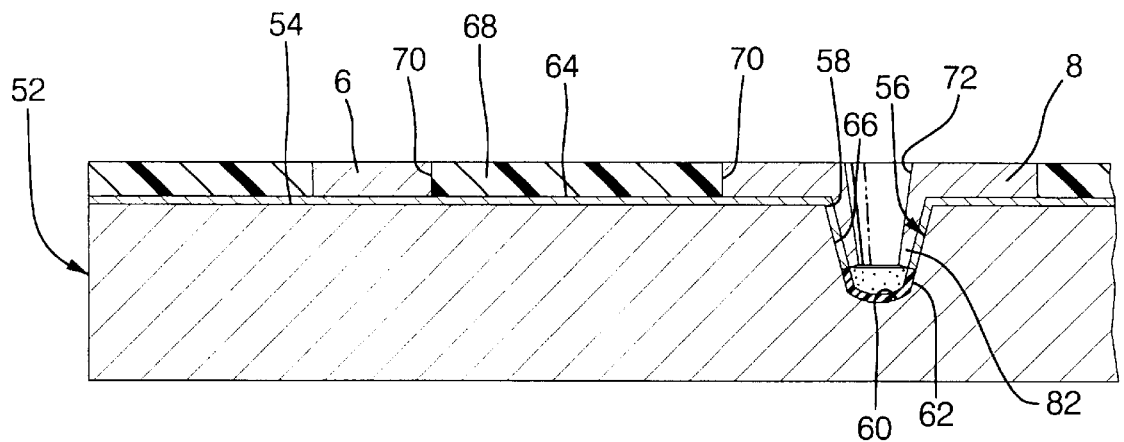
Figure 15:
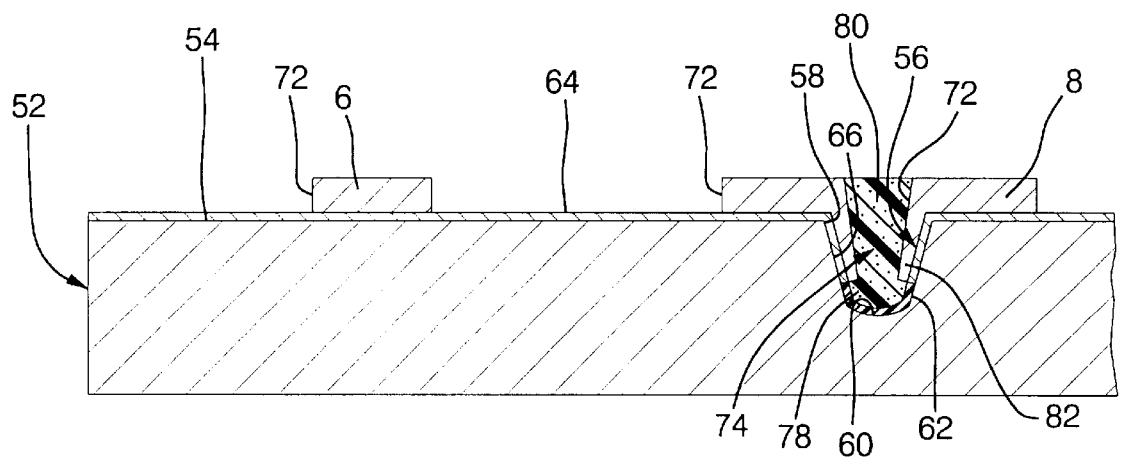
Figure 16:
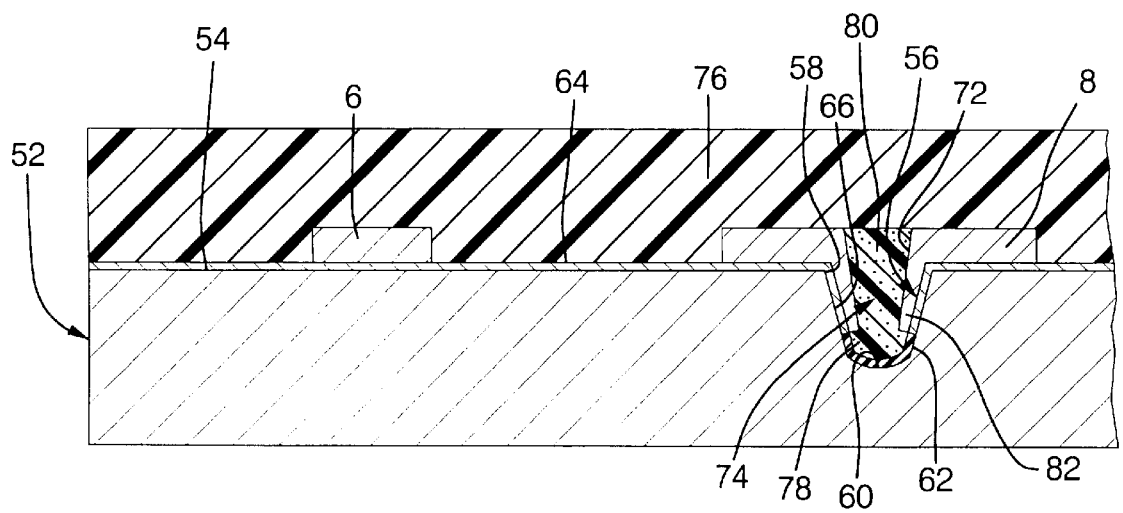

The depression 56 has its widest dimension at the mouth 58 thereof, and becomes progressively narrower as it approaches the bottom 60 of the depression 56. The depression 56 will preferably be conically shaped and have a thin layer of nonconductive material 62 covering the bottom 60 of the depression 56 which is made to adhere to the mandrel 52, but will not adhere to conductive elastomer formed there against. A suitable such material 62 is seen to be polytetrafluoroethylene, or the like. As illustrated in FIG. 12, a thin (i.e., about 5μ–50μ) layer of metal 64 (preferably flash electrodeposited copper) is deposited on the working surface 54 of the mandrel 52 and all of the inside surface 66 of the depression 56 except that covered by the material 62. The metal layer 64 will adhere to the mandrel 52, but not so strongly that it cannot be readily separated therefrom by peeling the cable from the mandrel in accordance with conventional practice.

A mask 68 (e.g., a photoresist mask) is next applied atop the thin metal layer 64. The mask 68 defines a plurality of openings 70 which conform to the configuration of the array of electrically conductive traces 6 to be formed on the cable and pad 2.

After the mask 68 has been applied atop the metal 64, electrically conductive traces 6 and termination contact portions 8 thereof, are electro-formed into the openings 70 in the mask 68. The electro-formed metal deposits on all of the inside surface 66 of the depression 56 except near the bottom 60 thereof which is covered with the nonconductive material 62. The electro-formed metal will have a thickness of about 25μ to about 50μ.

After the traces 6 and contact portions 8 have been electro-formed onto the metal coating 64 inside and outside the depression 56, the mask 68 is removed so as to leave the traces 6 and contact portions 8 standing in relief from the coating 64 on the mandrel 52. The mask 68 is preferably removed by a mild alkaline solution.

The electro-forming leaves a cavity 72 formed in the center of the contact portion 8 of trace 6 as a result of the presence of the depression 56 in the mandrel 52. This cavity 72 extends well below the surface 54 of the mandrel 52 and is filled with an electrically conductive elastomeric material 74 (as above) which is allowed to cure therein to a resilient state.

Figure 17:
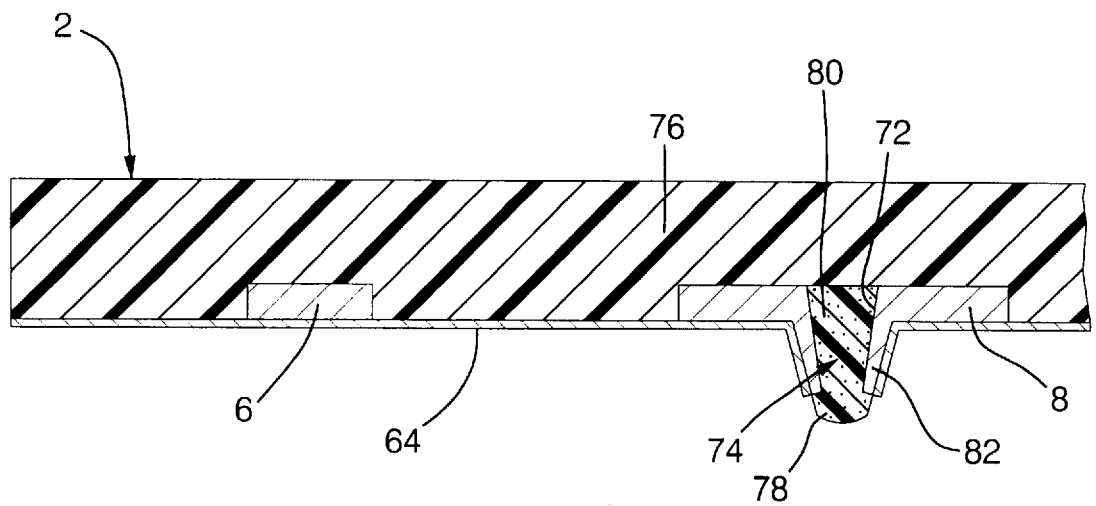
Figure 18:
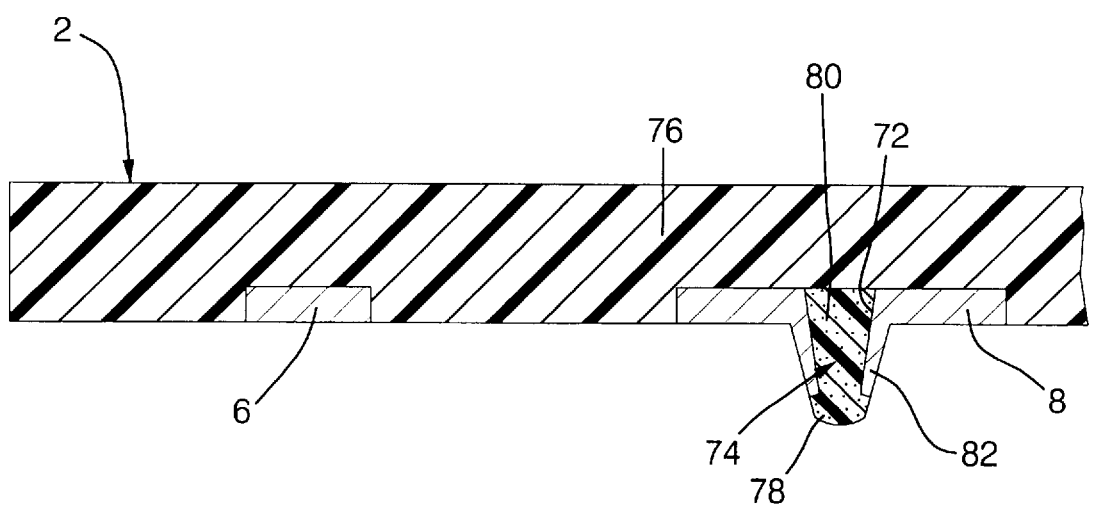

After the electrically conductive elastomer 74 has cured sufficiently in the cavity 72, the traces 6 and contact portions 8 are attached (preferably embedded in) a suitable dielectric material 76, as above. Thereafter and as best illustrated in FIG. 17, the pad 2 is peeled off of the mandrel 52 leaving the thin metal coating 64 covering the entire contact face of the pad 2 except the tip 78 of the elastomer 74.

After the pad 2 has been removed from the mandrel 52, the metal layer 64 is removed by chemical etching/dissolution thereof in a suitable etchant/solvent. Because the layer of nonconductive material 62 prevented metal from depositing thereon, it is not now necessary to remove metal from the tip 78 of the elastomer 74. As a result of this process, the base portion 80 of the elastomer 74 becomes anchored to, or embedded in, a truncated portion 82 of the contact portion 8 and leaves the tip 78 exposed as shown.

While the invention has been described primarily in terms of a specific embodiment thereof it is not intended to be limited thereto but rather only to the extent set forth hereafter in the claims which follows.

What is claimed is:

1. A method for making a printed-circuit-type electrical contact pad having a plurality of electrical contacts thereon, comprising the steps of:
  a. forming a plurality of depressions in a surface of a mandrel, each said depression corresponding to one of said contacts;
  b. covering said mandrel surface and the inside surfaces of said depressions with an electrically conductive coating which is readily separable from said surfaces;
  c. covering said coating with a mask having a plurality of openings for defining a desired array of electrically conductive traces each terminating at a said depression;
  d. depositing a sufficient amount of metal on said coating through said openings to form said traces and coat said inside surfaces of said depressions without filling said depressions, and so as to provide cavities in said traces at said depressions which extend well beneath said mandrel surface;
  e. removing said mask;
  f. filling said cavities with an electrically conductive elastomer and allowing it to cure in said cavities;
  g. applying a dielectric substrate to said traces;
  h. separating said dielectric substrate and traces from said mandrel so as to leave said electrically conductive coating adhering to said dielectric substrate;

i. removing said electrically conductive coating from said tracings and substrate; and j. removing a portion of said metal so as to expose a tip of said elastomer remote from said substrate for resiliently contacting a site on an electrical device with which the contact pad is associated, said tip portion extending from a base portion of said elastomer and standing in relief from said substrate, said base portion being embedded in, anchored to, a said trace by a truncated portion of said trace upstanding from said substrate.

2. A method according to claim 1 wherein said mask comprises a photoresist material.

3. A method according to claim 1 wherein said coating comprises electrodeposited copper.

4. A method according to claim 1 wherein said metal comprises electrodeposited copper.

5. A method according to claim 1 wherein said coating and said metal covering the tip of said elastomer are removed by dissolution.

6. A method according to claim 4 wherein said copper is deposited in said depression to a first thickness adjacent said mandrel surface and to a second thickness which is thinner than said first thickness and remote from said mandrel surface, and said removing of said portion of metal covering said tip is sufficient to remove only said second thickness of copper.

* * * * *